(12) United States Patent
Tang et al.

(10) Patent No.: US 10,250,786 B2
(45) Date of Patent: Apr. 2, 2019

(54) IMAGE CAPTURING MODULE WHICH HAS AN IMAGE PROCESSING BOARD DISPOSED AT A SIDE EDGE OF THE BODY OF THE IMAGE CAPTURING MODULE

(71) Applicant: SZ DJI TECHNOLOGY CO., LTD., Shenzhen (CN)

(72) Inventors: Yin Tang, Shenzhen (CN); Hualiang Qiu, Shenzhen (CN); Feihu Yang, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 19 days.

(21) Appl. No.: 15/481,829

(22) Filed: Apr. 7, 2017

(65) Prior Publication Data
US 2017/0214830 A1 Jul. 27, 2017

Related U.S. Application Data

(63) Continuation of application No. PCT/CN2014/088505, filed on Oct. 13, 2014.

(51) Int. Cl.
*H04N 5/225* (2006.01)
*H05K 7/20* (2006.01)
(Continued)

(52) U.S. Cl.
CPC ......... *H04N 5/2253* (2013.01); *G03B 15/006* (2013.01); *G03B 17/02* (2013.01);
(Continued)

(58) Field of Classification Search
CPC .. H04N 5/2253; H04N 5/2254; H04N 5/2257; H05K 7/20136; G03B 15/006; G03B 17/02; G03B 17/55
See application file for complete search history.

(56) References Cited

U.S. PATENT DOCUMENTS 6,371,770 B1 * 4/2002 Lai .................. G06F 1/1616
439/534
6,419,501 B1 * 7/2002 Okabe .................. H01R 12/79
439/77
(Continued)

FOREIGN PATENT DOCUMENTS

CN   101303444 A   11/2008
CN   101609836 A   12/2009
(Continued)

OTHER PUBLICATIONS

The World Intellectual Property Organization (WIPO) International Search Report for PCT/CN2014/088505 dated Jul. 17, 2015 6 Pages.

*Primary Examiner* — Luong T Nguyen
(74) *Attorney, Agent, or Firm* — Anova Law Group, PLLC (57) ABSTRACT

An image capturing module comprises a lens and a body. The body is provided with a circuit board component comprising a main control board, an image sensing board and an image processing board that are electrically connected. The image sensing board is substantially perpendicular to an optical axis of the lens. The main control board is disposed at the back of the image sensing board and located at a side thereof away from the lens. The image processing board is disposed at a side edge of the body.

18 Claims, 6 Drawing Sheets

(51) Int. Cl.
    *G03B 17/55*          (2006.01)
    *G03B 15/00*          (2006.01)
    *G03B 17/02*          (2006.01)

(52) U.S. Cl.
    CPC ........... *G03B 17/55* (2013.01); *H04N 5/2254* (2013.01); *H04N 5/2257* (2013.01); *H05K 7/20136* (2013.01)

(56) References Cited

U.S. PATENT DOCUMENTS

| | | | |
|---|---|---|---|
| 8,786,772 B2 * | 7/2014 | Tobinaga | H04N 5/2254 348/374 |
| 2007/0097652 A1 | 5/2007 | Huang | |
| 2009/0072039 A1 * | 3/2009 | Yamada | G06K 7/10722 235/462.42 |
| 2014/0055671 A1 * | 2/2014 | Kawamura | H04N 5/2252 348/374 |

FOREIGN PATENT DOCUMENTS

| | | |
|---|---|---|
| CN | 101907820 A | 12/2010 |
| CN | 202421698 U | 9/2012 |
| CN | 102955329 A | 3/2013 |
| CN | 203387593 U | 1/2014 |
| CN | 103634511 A | 3/2014 |
| CN | 203645739 U | 6/2014 |
| CN | 204180162 U | 2/2015 |
| JP | 2007134811 A | 5/2007 |

* cited by examiner

FIG. 6

# IMAGE CAPTURING MODULE WHICH HAS AN IMAGE PROCESSING BOARD DISPOSED AT A SIDE EDGE OF THE BODY OF THE IMAGE CAPTURING MODULE

CROSS-REFERENCE TO RELATED APPLICATION

This is a continuation application of International Application No. PCT/CN2014/088505, filed on Oct. 13, 2014, the entire contents of which are incorporated herein by reference.

TECHNICAL FIELD

The present disclosure relates to an image capturing module.

BACKGROUND

Image capturing modules are widely used in various famine tasks. For example, an image capturing module can be carried by an Unmanned Aerial Vehicle (UAV) for aerial filming. The image capturing module may include a lens and a body. The body may encompass internal hoard modules such as a main control module an image sensor module and an image processing module. Currently these modules may often be integrated on a same PCB board, causing a limited arrangement of other parts, such as a heat sink, and a non-compact arrangement inside the body.

SUMMARY

The present disclosure provides an image capturing module, a body of which has a compact internal space.

In accordance with the present disclosure, there is provided an image capturing module comprising a lens and a body coupled to the lens. The body comprises a circuit board component comprising an image sensing board, a main control board, and an image processing board electrically connected with each other. The image sensing board is arranged substantially perpendicular to an optical axis of the lens. The main control board is disposed on a side of the image sensing board that faces away from the lens. The image processing board is disposed at a side edge of the body.

In some embodiments, the main control board and the image sensing board are substantially in parallel, and electrically connected through a flexible circuit board.

In some embodiments, the flexible circuit board is in a bent shape and comprises one of a first male connector and a first female connector of a built-in circuit formed on a lower surface of an inner side of the flexible circuit board, and one of a second male connector and a second female connector of the built-in circuit formed on a lower surface of an outer side of the flexible circuit board. The main control board comprises another one of the first male connector and the first female connector. The image sensing board comprises another one of the second male connector and the second female connector. The first male connector is configured to be plugged into the first female connector to connect the main control board and the flexible circuit board. The second male connector is configured to be plugged into the second female connector to connect the image sensing board and the flexible circuit board.

In some embodiments, the image processing board is substantially parallel to the optical, axis of the lens. The image processing board and the main control board are electrically connected to each other through a flexible circuit board.

In some embodiments, the flexible circuit board comprises a first connecting portion extending from an end of the flexible circuit board and connected to the main control board, and a second connecting portion extending from a side edge of the flexible circuit board and connected to the image sensing board.

In some embodiments, the image processing board is an image compression processing board.

In some embodiments, the body comprises a support component comprising a first fixing member and a second fixing member disposed opposite to the first fixing member. The image sensing board is fixed on end faces, of the first fixing member and the second fixing member. The main control board and the image sensing board are disposed substantially in parallel to each other. The image processing board is fixed to a side face of the first fixing member.

In some embodiments, the body further comprises a hollow, annular sealing gasket provided between the image sensing board and the first and second fixing members.

In some embodiments, the first fixing member and the second fixing member comprise a plurality of first connecting posts extending smoothly on inner sides of the first fixing member and the second fixing member, and a plurality of second connecting posts each disposed at a position adjacent to one of the plurality of first connecting posts. Heights of the second connecting posts along a direction of the optical axis of the lens are higher than heights of the first connecting posts along the direction of the optical axis of the lens. The image sensing board is fixed on the plurality of first connecting posts through screws inserted through the gasket. The main control board is fixed on the plurality of the second connecting posts through studs.

In some embodiments, the body further comprises an outer side plate having a receiving space receiving the image processing board and an inner side plate covering the receiving space. The image processing board is fixed to a side face of the first fixing member through the inner side plate and the outer side plate.

In some embodiments, the body further comprises a heat dissipation component comprising a fan fixed to a side face of the second fixing member and a heat sink disposed on the main control board.

In some embodiments, the fan comprises a housing having a hollow internal space and an air outlet located at a side of the housing, and a rotating portion assembled in the housing. The heat sink comprises a base having an end face connecting to the air outlet, a plurality of fins disposed on the base, and an inlet end of the air duct connecting to the end face of the base. An air duct is formed between two adjacent fins. The heat sink further comprises a heat conduction gasket filled between the base and the main control board.

In some embodiments, the body further comprises an air duct cover plate provided on the fins. The air duct cover plate comprises a tab extending from an end portion of the air duct cover plate and covering the air outlet of the fan, and snap sheets extending downwards from two side laces of the air duct cover plate and forming a receiving space for receiving the fins.

In some embodiments, each of the fins has a first inclination surface that is inclined relative to the base at the inlet end of the air duct. The tab has a second inclination surface that is inclined relative to the air duct cover plate towards surfaces of the fins. The first inclination surfaces and the second inclination surface match with each other.

In some embodiments, the body further comprises a back end cover disposed on the air duct cover plate and comprising a ventilation opening.

Also in accordance with the present disclosure, there is provided an image capturing module comprising a body comprising a circuit board component. The circuit board component comprises an image sensing board, a main control hoard disposed at a back of the image sensing hoard and being substantially parallel to the image sensing board, and an image processing board disposed at a side edge of the body and being substantially perpendicular to the image sensing board and the main control board. The image sensing board, the main control board, and the image processing board are electrically connected with each other.

In some embodiments, the main control board and the image sensing board are electrically connected through a first flexible circuit board, and the image processing board and the main control board are electrically connected through a second flexible circuit board.

In some embodiments, the body has a support component comprising a first fixing member and a second fixing member disposed opposite to the first fixing member. The image sensing board is fixed on end faces of the first fixing member and the second fixing member. The image processing board is fixed to a side face of the first fixing member.

In some embodiments, the body further comprises a heat dissipation component comprising a fan fixed to a side face of the second fixing member and a heat sink disposed on the main control board.

In some embodiments, the fan comprises a housing having a hollow internal space and an air outlet located at a side of the housing, and a rotating portion assembled in the housing. The heat sink comprises a base having an end face connecting to the air outlet and a plurality of fins disposed on the base. An air duct is formed between two adjacent fins. An inlet end of the air duct connects to the end face of the base. The heat sink further comprises a heat conduction gasket filled between the base and the main control board.

In some embodiments, the body further comprises an air duct cover plate provided on the fins. The air duct cover plate comprises a tab extending from an end portion of the air duct cover plate and covering the air outlet of the fan, and snap sheets extending, downwards from two side faces of the air duct cover plate and forming a receiving space for receiving the fins.

In some embodiments, each of the fins has a first inclination surface that is inclined relative to the base at the inlet end of the air duct. The tab has a second inclination surface that is inclined relative to the air duct cover plate towards surfaces of the tins. The first inclination surfaces and the second inclination surface match with each other.

In some embodiments, the body further comprises a hack end cover disposed on the air duct cover plate and comprising a ventilation opening.

According to embodiments of the present disclosure, a circuit board within a body may be separated into several sub circuit boards, i.e., a main control board and an image sensing board disposed at the hack of a lens, and an image processing hoard disposed at a side, edge of the body. With such an arrangement, the body may have a compact internal space, making it easier to arrange other elements such as a heat sink and the like.

REFERENCE NUMBERS OF ELEMENTS

TABLE 1

| | |
|---|---|
| image capturing module | 100 |
| lens | 10 |
| body | 20 |
| first fixing member | 211 |
| second fixing member | 212 |
| third fixing member | 213 |
| fourth fixing member | 214 |
| main control board | 221 |
| image sensor board | 222 |
| image sensing face | 222f |
| image processing board | 223 |
| first male connector | 221a |
| second male connector | 222a |
| first flexible circuit board | 25 |
| first female connector | 251 |
| second female connector | 252 |
| first connecting post | 256 |
| second connecting post | 258 |
| assembly hole | 256a, 255a, 258a |
| sealing gasket | 26 |
| copper stud | 255 |
| inner side plate | 225 |
| outer side plate | 226 |
| receiving space | 227 |
| second flexible circuit board | 27 |
| first connecting portion | 272 |
| second connecting portion | 274 |
| copper screw | 228, 229, 224, 238 |
| fan | 231 |
| heat sink | 232 |
| housing | 231a |
| rotating portion | 231b |
| air outlet | 231c |
| side cover | 233 |
| base | 232a |
| end face | 232c |
| fin | 232b |
| air duct | 232e |
| first inclination surface | 232d |
| side extending sheet | 232f |
| air duct cover plate | 235 |
| tab | 235a |
| snap sheet | 235b |
| second inclination surface | 235c |
| back end cover | 234 |
| ventilation opening | 234a |

Exemplary embodiments of the present disclosure will be described detail with reference to the above-described drawings.

DETAILED DESCRIPTION OF THE EMBODIMENTS

Exemplary embodiments of the present disclosure will be described in detail below in combination with the drawings. It should be appreciated that embodiments described herein are only some rather than all of the embodiments of they present disclosure. All other embodiments obtained by those having ordinary skill in the art on the basis of the embodiments of the present disclosure without any inventive efforts should fall within the scope of the present disclosure.

An image capturing module in accordance with an embodiment of the present disclosure can be used in large scale filming apparatuses, as well as in small to middle scale filming apparatuses. Parts within a body of the image capturing module are arranged compactly. Particularly, a circuit board and a heat dissipation component are reasonably arranged, such that the heat dissipation component has a good heat dissipation effect.

Figure 1:
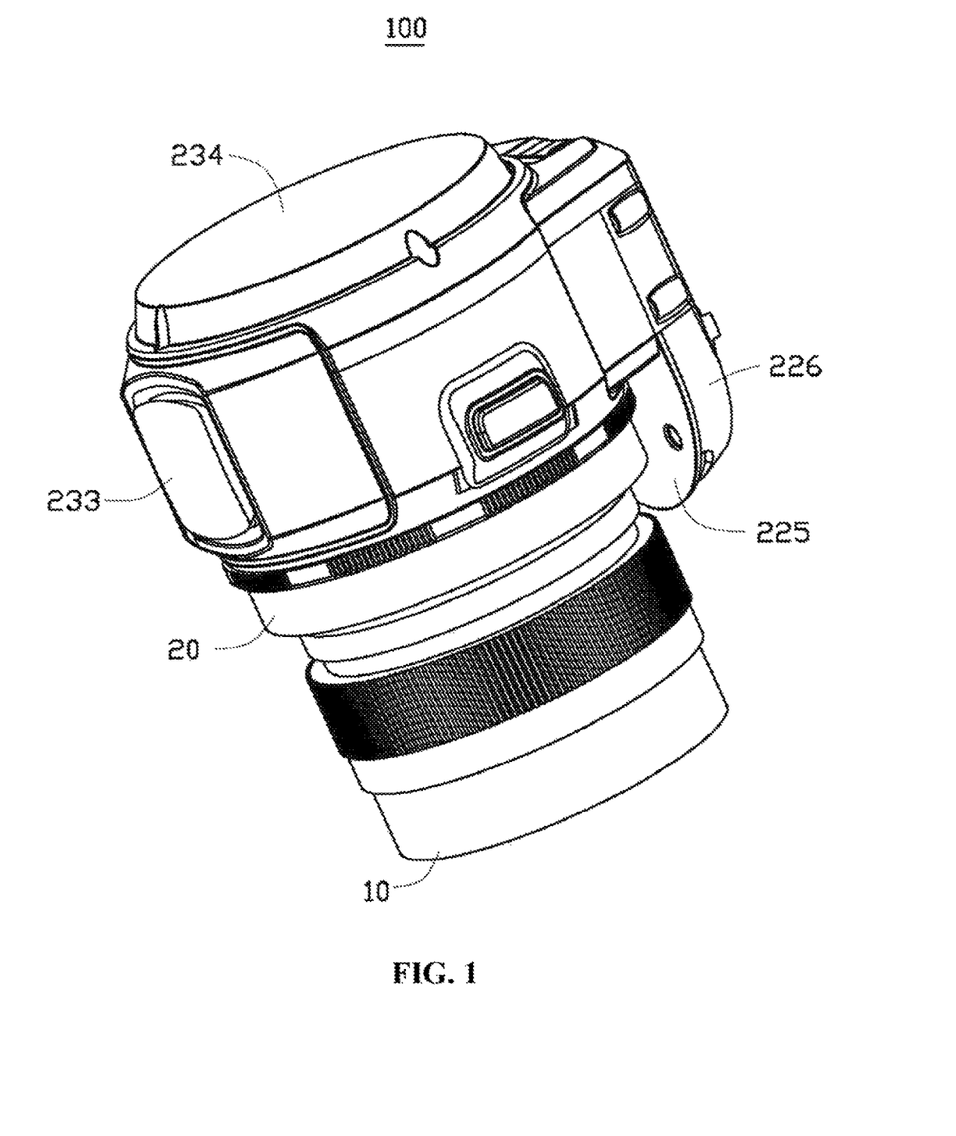
FIG. 1 is a perspective view of an image capturing module according to an embodiment of the present disclosure.
Figure 2:
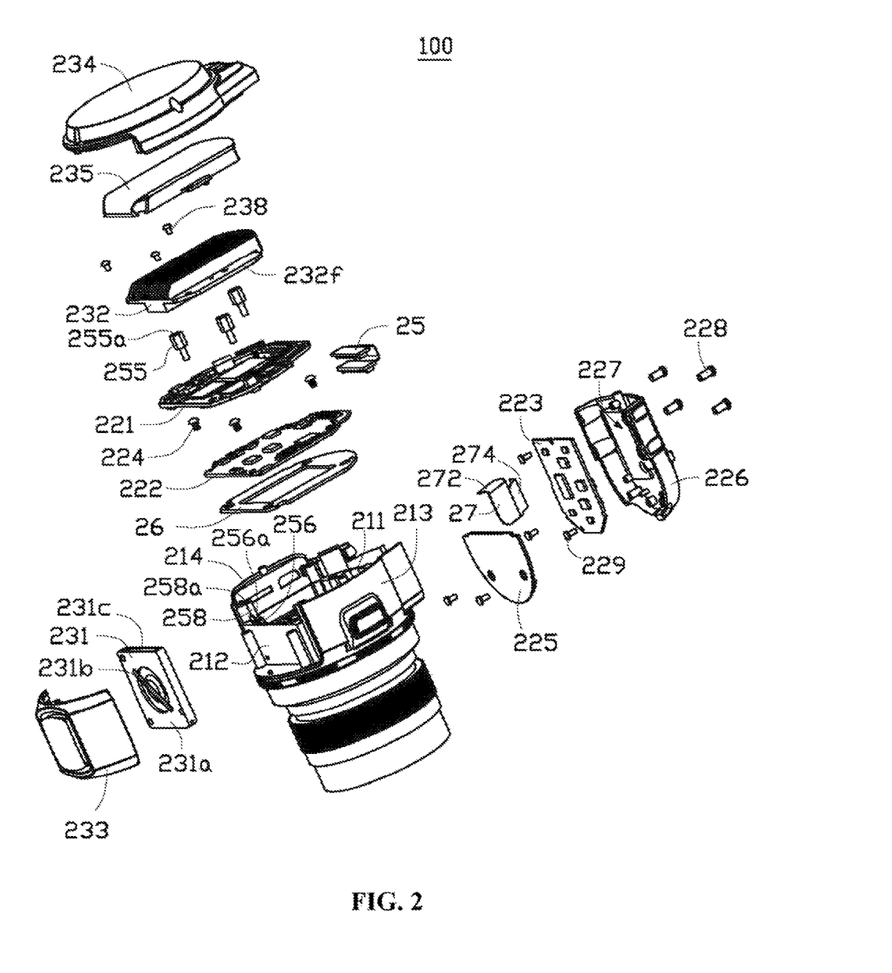
FIG. 2 is an exploded view of the image capturing module of FIG. 1.

In some embodiments, referring, to FIG. 1 and FIG. 2, an image capturing module 100 in accordance with an embodiment of the present disclosure may comprise a lens 10 and a body 20. The body 20 may be provided with a support member component, a circuit board component, and a heat dissipation component.

The support member component may comprise a first fixing member 211, a second fixing member 212, a third fixing member 213, and a fourth fixing member 214 that are integrally formed with the body 20. The first fixing member 211 and the second fixing member 212 may be disposed opposite to each other. The third fixing member 213 and the fourth fixing member 214 may be disposed opposite to each other. The first fixing member 211, the second fixing member 212, the third fixing member 213, and the fourth fixing member 214 are arranged for disposing the circuit board component and the heat dissipation component. A height of the first fixing member 211 along a direction of an optical axis of the lens 10 may be the same as a height of the second fixing member 212 along the direction of the optical axis of the lens 10. A height of the third fixing member 213 along the direction of the optical axis of the lens 10 may be the same as a height of the fourth fixing member 214 along the direction of the optical axis of the lens 10. The heights of the first fixing member 211 and the second fixing member 212 along the direction of the optical axis of the lens 10 may be lower than the heights of the third fixing member 213 and time fourth fixing member 214 along the direction of the optical axis of the lens 10 (as shown in FIG. 2). A press key, for example, may be arranged on the third fixing member 213 and the tough fixing member 214 for dismounting and mounting the lens 10. The first fixing member 211, the second fixing member 212, the third fixing member 213, and the fourth fixing member 214 may jointly enclose a hollow space, which allows the lens 10 to, for example, move forward/backward and to zoom.

Figure 3:
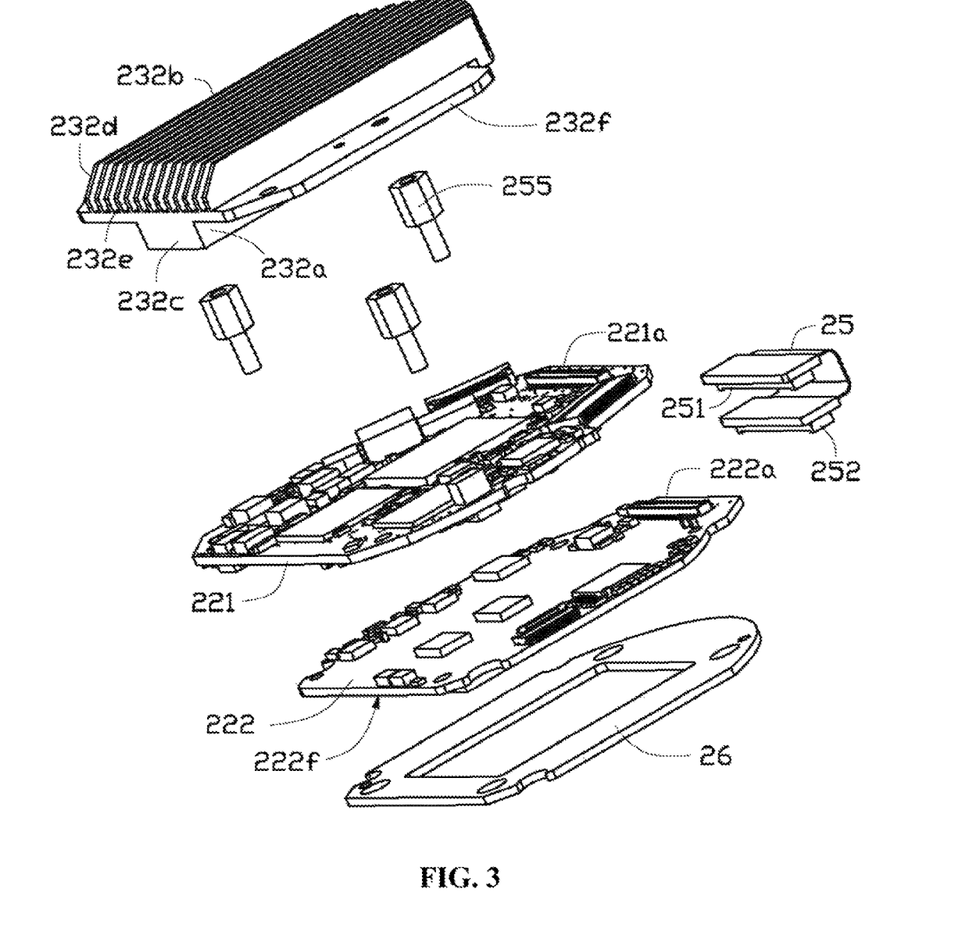
FIG. 3 is an enlarged schematic view of elements such as a heat sink, a main control board, an image sensing board and the like of FIG. 2.
Figure 4:
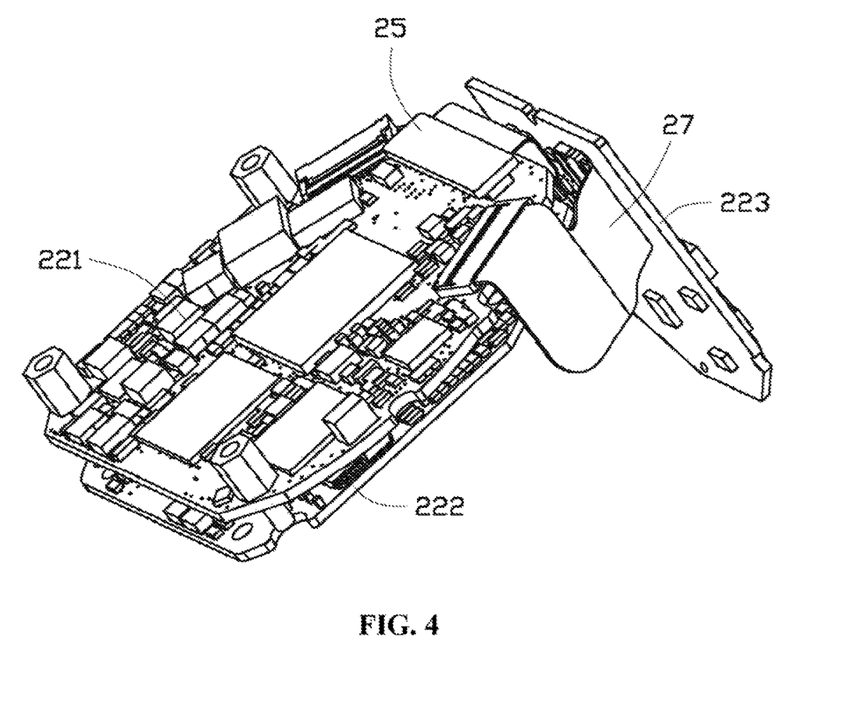
FIG. 4 is a schematic view showing an arrangement of a circuit board component of FIG. 2 after connected through a flexible circuit hoard.

Referring to FIG. 3 and FIG. 4, the circuit hoard component may comprise a main control board 221, an image sensor board 222, and an image processing board 223. The main control board 221 and the image sensor board 222 may be substantially disposed in parallel, and may each include a main surface where a length and a width of the board lie that may be substantially perpendicular to the direction of the optical axis of the lens 10. The main control board 221 may be located above the image sensor board 222 and there is a spacing between the main control hoard 221 and the image sensor board 222. A main surface of the image processing board 223 where a length and a width of the image processing board 223 lie may be substantially parallel to the direction of the optical axis of the lens 10.

In some embodiments, a plurality of first connecting posts 256 may be formed and extend smoothly on inner sides of the first fixing member 211 and the second fixing member 212. Each of the first connecting posts 256 may include an assembly hole 256a. An annular hollow sealing gasket 26 may be placed on the first connecting posts 256. A plurality of copper screws 224 may be inserted through the image sensor board 222 at an edge of the image sensor board 222. The plurality of copper screws 224 may further pass, through the sealing gasket 26 and be assembled into the assembly holes 256a, to dispose die image sensor hoard 222 on the first fixing member 211 and the second fixing member 212. An image sensing face 222f of the image sensor board 222 orients towards the lens 10. The sealing gasket 26 may prevent light from leaking to outside. In some embodiments, the sealing gasket 26 may be made of rubber.

A plurality of second connecting posts 258 may be provided on inner sides of every adjacent two of the first fixing member 211, the second fixing member 212, the third fixing member 213, and the fourth fixing member 214. Heights of the plurality of second connecting posts 258 along the direction of the optical axis of the lens 10 may all be higher than heights of the first connecting posts 256 along the direction of the optical axis of the lens 10, but lower than the heights of the third fixing member 213 and the fourth fixing member 214 along the direction of the optical axis of the lens 10. Each one of the second connecting posts 258 may be provided with an assembly hole 258a. A plurality of copper studs 255 may be inserted through the main, control board 221 at an edge of the main control board 221. The plurality of copper studs 255 may be assembled in the assembly holes 258a, to fix the main control board 221 on the plurality of second connecting posts 258. The main control board 221 and the image sensor board 222 may have a spacing therebetween, which may prevent circuits on the main control board 221 and the image sensor board 222 from touching each other to cause short circuit.

The main control board 221 and the image sensor board 222 may be electrically connected through a first flexible circuit board 25. In some embodiments, the main control board 221 may be provided with a first male connector 221a of a built-in circuit, and the image sensor hoard 222 may be provided with a second male connector 222a of the built-in circuit. The first flexible circuit hoard 25 may be bent perpendicularly to be in "]" shape. A lower surface of the inner side of the first flexible circuit board 25 may be provided with a first female connector 251 of the built-in circuit, and a lower surface of an outer side of the first flexible circuit board 25 may be provided with a second female connector 252 of the built-in circuit. The first male connector 221a may be inserted in the first female connector 251, and the second male connector 222a may be inserted in the second female connector 252. As such, the image sensor board 222 and the main control board 221 can be electrically connected to each other.

It should be understood that, the image sensor board 222 and the main control board 221 may be electrically connected using other connecting means, such as a connector, and it is not limited to the present embodiment.

The image processing board 223 may be fixed on an external side of the first fixing member 211 through matching of an inner side plate 225 and an outer side plate 226. The outer side plate 226 may have a hollow receiving space 227, and the image processing board 223 may be fixed in the receiving space 227 through copper screws 229. The inner side plate 225 may be used as a cover plate. The image processing board 223 may be electrically connected with the main control board 221 through a second flexible circuit board 27, which may have a first connecting portion 272 extending from an end of the second flexible circuit board 27 and a second connecting portion 274 extending from a side edge of the second flexible circuit 27. The first connecting portion 272 may be connected to the main control board 221. The second connecting portion 274 may be connected to the image processing board 223. As such, the main control hoard 221, the image sensor board 222, and the image processing board 223 may be electrically connected to each other. The image processing hoard 223, the main control board 221, and the image sensor board 222 may be arranged in an inverted L shape, with the image processing board 223 being a vertical portion of the inverted L shape, and the main control board 221 and the image sensor board 222 being a horizontal portion of the inverted L shape (as shown in FIG. 4). The image processing board 223, the inner side plate 225, and the outer side plate 226 may be connected in series through copper screws 228, and be fixed to an outer side face of the first fixing member 221 by the copper screws 229. In some embodiments, the image processing board 223 may be an image compression processing board.

It can be understood that, in some other embodiments, the second flexible circuit board 27 may be electrically connected with the image sensor board 222, such that the main control board 221, the image sensor board 222, and the image processing board 223 are electrically connected to each other. The first connecting portion 272 of the second flexible circuit board 27 may be connect to the image sensor board 222, and the second connecting portion 274 may be connected to the image, processing, board 223. In some other embodiments, the second flexible circuit board 27, the image sensor board 222, and the image processing board 223 may be connected in another manner not limited to the present embodiment.

Figure 5:
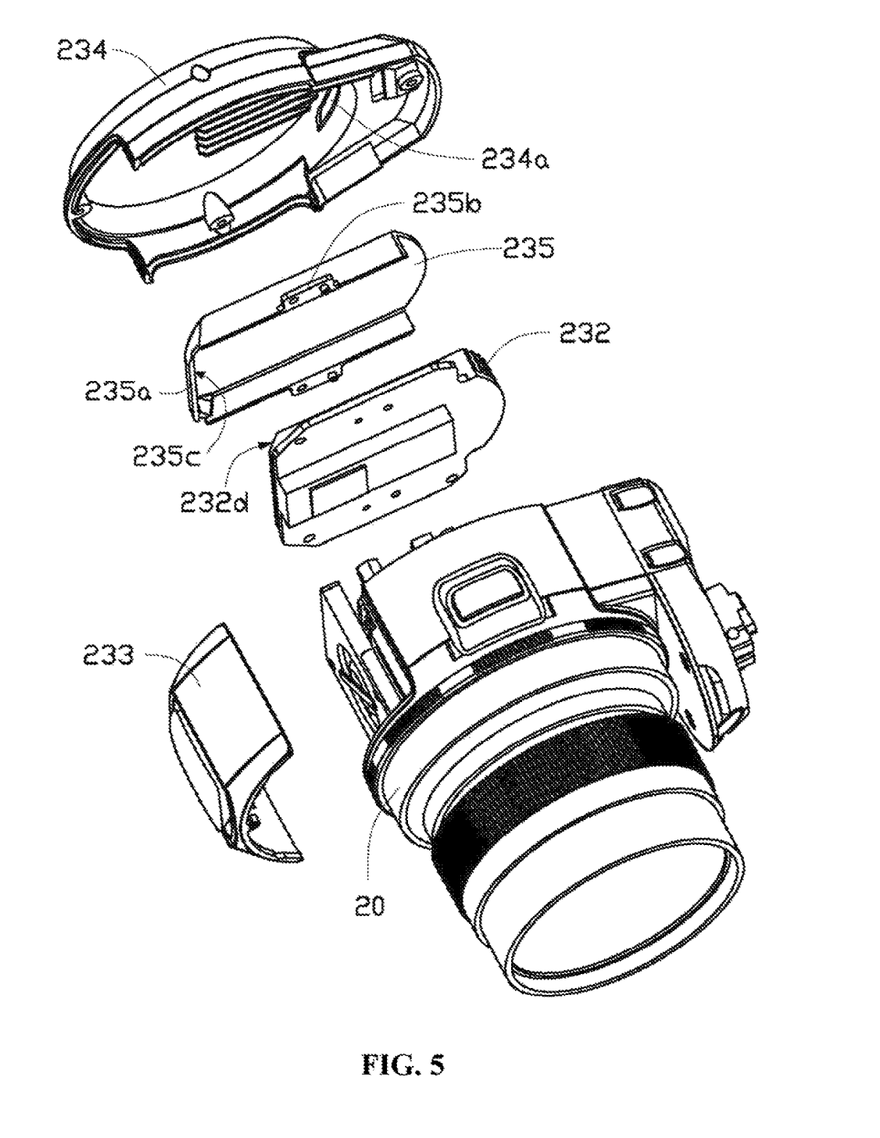
FIG. 5 is a local assembly schematic view of FIG. 2 and different from FIG. 2 in an angle of view.

The heat dissipation component may comprise a fan 231 and a heat sink 232. The fan 231 may comprise a housing 231a and a rotating portion 231b. The housing 231a may be hollow inside. A side of the housing 231a may have an air outlet 231e. An air-out direction of the air outlet 231c may be approximately perpendicular to the rotating portion 231b. The rotating portion 231b may be mounted into an internal space of the housing 231a from a surface of the housing 231a. A rotation of the rotating portion 231b may cause air to flow out from the fan 231 through the air outlet 231e. The fan 231 may be fixed to an outer side of the second fixing member 212 through a side cover 233, with the air outlet 231c facing upwards (as shown in FIG. 5). The heat sink 232 may be fixed on the copper studs 255 on the main control board 221 through a plurality of copper screws 238. Each of the copper studs 255 may be provided with an assembly hole 255a. The copper screws 238 may be inserted through a side extending sheet 232f of the heat sink 232 and be assembled in the assembly holes 255a. There may be a spacing between the heat sink 232 and the main control board 221. A heat conduction gasket may be filled in the spacing. The heat sink 232 may contact with the main control board 221 through the heat conduction gasket, to dissipate heat generated by the main control board 221. The heat sink 232 may include a base 232a and, a plurality of fins 232b that are integrally formed with and extend from the base 232a. The side extending sheet 232f may extend from both skies of the base 232a. The base 232a may have a smooth end face 232c provided on an edge of the air outlet 231c. An air-venting direction of the air outlet 231c may be approximately parallel to the end face 232c. The plurality of fins 232b may be disposed in parallel to each other, and a longitudinal direction of the fins 232b may be parallel to a main surface of the main control board 221. An air duct 232e may be formed between two adjacent fins 232b. An inlet end of the air duct 232e may be connected with the end face 232c of the base 232a, Each fin 232b may include a first inclination surface 232d inclined relative to the base 232a and formed at the inlet end of the air duct 232e.

Figure 6:
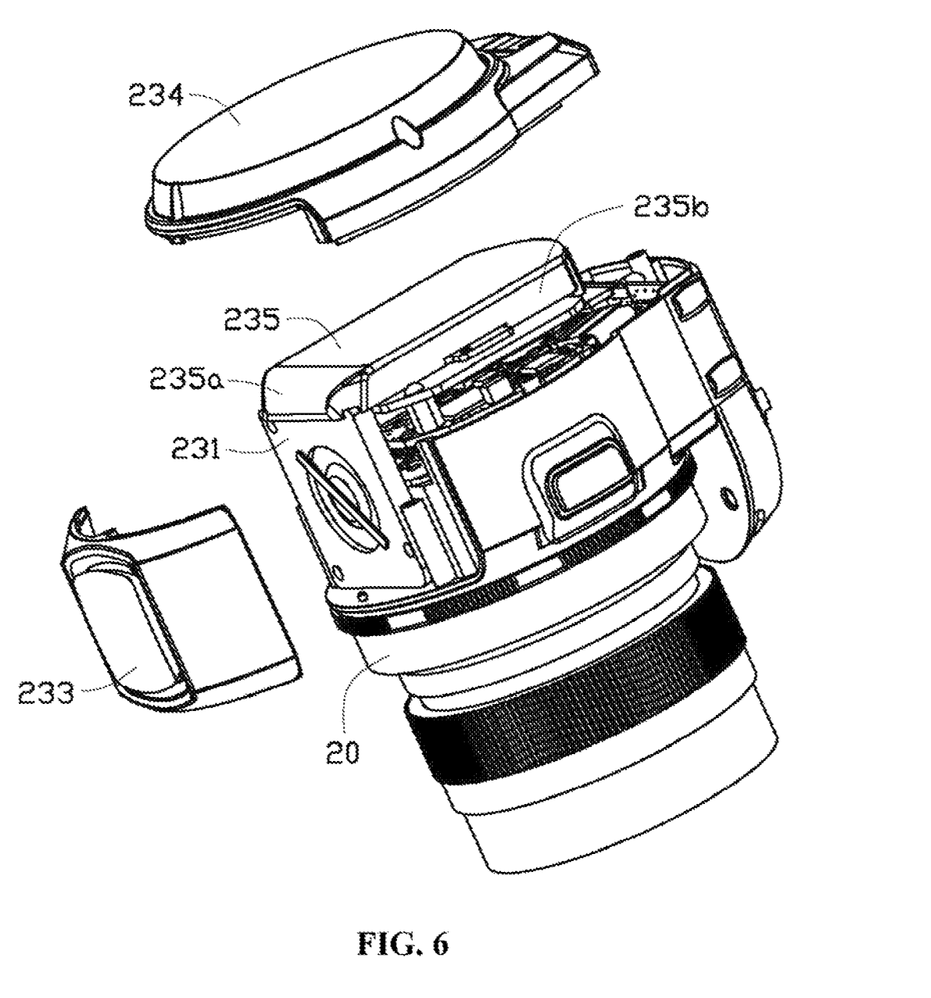
FIG. 6 is also a local assembly schematic view of FIG. 2 and different from FIG. 5 in an angle of view.

Referring to FIG. 5 and FIG. 6, an air duct cover plate 235 may be provided above the fins 232b of the heat sink 232. A tab 235a may be formed at an end portion of the air duct cover plate 235 where the tab 235a may extend inclinedly from the end portion of the air duct cover plate 235. Snap plates 235b may respectively be formed at and extend from two side portions of the air duct cover plate 235 that are adjacent to the end portion. A second inclination surface 235c is formed at a bottom surface of the tab 235a to match with the first inclination surfaces 232d of the fins 232b. The tab 235a may cover the air outlet 23k of the fan 231. The first inclination surface 232d and the second inclination surface 235c may match with each other to assist in changing a blowing direction from the air outlet 23k, changing the flowing direction from a direction perpendicular to the base 232a to a direction approximately parallel to the base 232a. As such, a heat dissipation flow can enter into the air duct 232c more effectively, Meanwhile, air from the air duct 231c may be prevented from partially escaping from the heat sink 232 without dissipating heat for various circuit boards. Therefore, a heat dissipation efficiency can be improved. The two snap plates 235b may form a receiving space for receiving the fins 232b and can be fixed on the side extending sheet 232f of the base 232a.

A backend cover 234 may be provided above the air duct cover plate 235, and cover a backend portion of the whole body 20. A heat dissipation space may be formed in the body 20. The backend cover 234 may have a ventilation opening 234a to facilitate heat dissipation.

The outer side plate 226 may be further connected to an external device, such as a gimbal.

In summary, a circuit board of the image capturing module 100 in accordance with the present disclosure may be separated into three pieces, i.e., the main control board 221 and the image sensor board 222 that are disposed spaced apart with one above another, and an image processing board 223 disposed at a side edge of the body 20. Further, the fan 231 and the heat, sink 232 may be separated, with the fan 231 being disposed on another side edge of the body 20 and the heat sink 232 being disposed above the main control board 221. A heat dissipation space may be formed in the body 20. The backend cover 234 may have the ventilation opening 234a to exchange air with the environment. Such arrangement of parts of the body 20 is compact, and the heat dissipation component has a good heat dissipation effect.

The foregoing description is merely illustrative of the embodiments of the disclosure, and is not intended to limit the scope of the disclosure. Any equivalent structural or flow variations made on the basis of the description and the drawings of the disclosure, and their direct or indirect applications to other relevant technical fields, shall all fall into the scope of the disclosure.

What is claimed is:

1. An image capturing module comprising:
   a lens; and
   a body coupled to the lens, the body comprising:
      a support component comprising:
         a first fixing member; and
         a second fixing member disposed opposite to the first fixing member; and
      a circuit board component comprising:
         an image sensing board fixed on end faces of the first fixing member and the second fixing member and arranged substantially perpendicular to an optical axis of the lens;

a main control board disposed on a side of the image sensing board that faces away from the lens and substantially parallel to the image sensing board; and an image processing board disposed at a side edge of the body and fixed to a side face of the first fixing member, wherein the image sensing board, the main control board, and the image processing board are electrically connected with each other.

2. The image capturing module of claim 1, wherein the main control board and the image sensing board are electrically connected through a flexible circuit board.

3. The image capturing module of claim 2, wherein:
the flexible circuit board is in a bent shape and comprises:
one of a first male connector and a first female connector of a built-in circuit formed on a lower surface of an inner side of the flexible circuit board; and
one of a second male connector and a second female connector of the built-in circuit formed on a lower surface of an outer side of the flexible circuit board,
the main control board comprises another one of the first male connector and the first female connector,
the image sensing board comprises another one of the second male connector and the second female connector,
the first male connector is configured to be plugged into the first female connector to connect the main control board and the flexible circuit board, and
the second male connector is configured to be plugged into the second female connector to connect the image sensing board and the flexible circuit board.

4. The image capturing module of claim 1, wherein:
the image processing board is substantially parallel to the optical axis of the lens, and
the image processing board and the main control board are electrically connected to each other through a flexible circuit board.

5. The image capturing module of claim 4, wherein the flexible circuit board comprises:
a first connecting portion extending from an end of the flexible circuit board and connected to the main control board; and
a second connecting portion extending from a side edge of the flexible circuit board and connected to the image sensing board.

6. The image capturing module of claim 1, wherein the image processing board is an image compression processing board.

7. The image capturing module of claim 1, wherein the body further comprises a hollow annular sealing gasket provided between the image sensing board and the first and second fixing members.

8. The image capturing module of claim 7, wherein:
the first fixing member and the second fixing member comprise:
a plurality of first connecting posts extending smoothly on inner sides of the first fixing member and the second fixing member; and
a plurality of second connecting posts each disposed at a position adjacent to one of the plurality of first connecting posts, heights of the second connecting posts along a direction of the optical axis of the lens being higher than heights of the first connecting posts along the direction of the optical axis of the lens, the image sensing board is fixed on the plurality of first connecting posts through screws inserted through the gasket, and
the main control board is fixed on the plurality of the second connecting posts through studs.

9. The image capturing module of claim 1, wherein:
the body further comprises:
an outer side plate having a receiving space receiving the image processing board; and
an inner side plate covering the receiving space, and
the image processing board is fixed to a side face of the first fixing member through the inner side plate and the outer side plate.

10. The image capturing module of claim 1, wherein the body further comprises a heat dissipation component comprising:
a fan fixed to a side face of the second fixing member; and
a heat sink disposed on the main control board.

11. The image capturing module of claim 10, wherein:
the fan comprises:
a housing having a hollow internal space and an air outlet located at a side of the housing; and
a rotating portion assembled in the housing, and
the heat sink comprises:
a base having an end face connecting to the air outlet;
a plurality of fins disposed on the base, an air duct being formed between two adjacent fins, and an inlet end of the air duct connecting to the end face of the base; and
a heat conduction gasket filled between the base and the main control board.

12. The image capturing module of claim 11, wherein the body further comprises an air duct cover plate provided on the fins, the air duct cover plate comprising:
a tab extending from an end portion of the air duct cover plate and covering the air outlet of the fan; and
snap sheets extending downwards from two side faces of the air duct cover plate and forming a receiving space for receiving the fins.

13. The image capturing module of claim 12, wherein:
each of the fins has a first inclination surface that is inclined relative to the base at the inlet end of the air duct,
the tab has a second inclination surface that is inclined relative to the air duct cover plate towards surfaces of the fins, and
the first inclination surface and the second inclination surface match with each other.

14. The image capturing module of claim 12, wherein the body further comprises a back end cover disposed on the air duct cover plate and comprising a ventilation opening.

15. An image capturing module comprising:
a body comprising:
a support component comprising:
a first fixing member; and
a second fixing member disposed opposite to the first fixing member; and
a circuit board component comprising:
an image sensing board fixed on end faces of the first fixing member and the second fixing member;
a main control board disposed at a back of the image sensing board and being substantially parallel to the image sensing board; and
an image processing board disposed at a side edge of the body and fixed to a side face of the first fixing member, the image processing board being substantially perpendicular to the image sensing board and the main control board, wherein the image sensing board, the main control board, and the image processing board are electrically connected with each other.

16. The image capturing module of claim 15, wherein the main control board and the image sensing board are electrically connected through a first flexible circuit board, and the image processing board and the main control board are electrically connected through a second flexible circuit board.

17. The image capturing module of claim 15, wherein the body further comprises a heat dissipation component comprising:

a fan fixed to a side face of the second fixing member, and a heat sink disposed on the main control board.

18. The image capturing module of claim 17, wherein:

the fan comprises:

a housing having a hollow internal space and an air outlet located at a side of the housing; and a rotating portion assembled in the housing, and the heat sink comprises:

a base having an end face connecting to the air outlet;

a plurality of fins disposed on the base, an air duct being formed between two adjacent fins, and an inlet end of the air duct connecting to the end face of the base; and a heat conduction gasket filled between the base and the main control board.

* * * * *